United States Patent
Kim et al.

[11] Patent Number: 5,977,620
[45] Date of Patent: Nov. 2, 1999

[54] LEAD FRAME HAVING A NI-MN ALLOY LAYER AND A PD LAYER

[75] Inventors: Joong-do Kim; Young-ho Baek; Kyoung-soon Bok, all of Kyungki-do, Rep. of Korea

[73] Assignee: Samsung Aerospace Industries, Ltd., Kyongsangnam-do, Rep. of Korea

[21] Appl. No.: 09/081,436

[22] Filed: May 19, 1998

[30] Foreign Application Priority Data

May 20, 1997 [KR] Rep. of Korea ................ 97-19556

[51] Int. Cl.[6] .................... H01L 23/48; H01L 23/52; H01L 23/34; H01L 29/52
[52] U.S. Cl. ................... 257/677; 257/666; 257/758; 257/766; 257/769; 257/783
[58] Field of Search ................... 257/666, 677, 257/758, 762, 766, 769, 783

[56] References Cited

U.S. PATENT DOCUMENTS

| | | | |
|---|---|---|---|
| 4,517,584 | 5/1985 | Matsushita et al. | 257/705 |
| 4,845,543 | 7/1989 | Okikawa et al. | 257/738 |
| 5,019,891 | 5/1991 | Onuki et al. | 257/763 |
| 5,578,869 | 11/1996 | Hoffman et al. | 257/691 |
| 5,629,559 | 5/1997 | Miyahara | 257/666 |

*Primary Examiner*—Alexander Oscar Williams
*Attorney, Agent, or Firm*—Finnegan, Henderson, Farabow, Garrett & Dunner, L.L.P.

[57] ABSTRACT

A method for manufacturing a lead frame includes degreasing and activating the surface of a metal sheet, providing the plating solution containing nickel(II) sulfamate tetrahydrate, $(Ni(H_2NSO_3)_2 \cdot 4H_2O)$, manganese(II) sulfamate tetrahydrate $(Mn(H_2NSO_3)_2 \cdot 4H_2)$, nickel (II) chloride hexahydrate $(NiCl_2 \cdot 6H_2O)$ and boric acid, plating the metal sheet in the plating solution to form a Ni—Mn alloy layer, and forming a Pd or Pd alloy layer on the Ni—Mn alloy layer.

8 Claims, 2 Drawing Sheets

LEAD FRAME HAVING A NI-MN ALLOY LAYER AND A PD LAYER

BACKGROUND OF THE INVENTION

1. Field of the Invention

The present invention relates to a lead frame having an improved plating layer and a method for manufacturing the same.

2. Description of the Related Art

As shown in FIG. 1, Silver(Ag) plating is selectively performed on a coined part 11 and a pad part 12, where a chip is mounted on a conventional lead frame 10. To enhance soldering properties after resin molding in a semiconductor package process, solder plating is performed on an outer lead 13 of the lead frame 10 using tin-lead (Sn—Pb). The wet process required for solder plating the resin-molded structure causes deterioration in the reliability of the lead frame.

To solve the above problem, a method for pre-coating a lead frame 20 has been developed with a plating layer having good solder wettability before the semiconductor packaging process. As shown in FIG. 2, the lead frame material, a copper (Cu) sheet 21, is coated with a nickel (Ni) layer 22. A palladium (Pd)—Ni alloy layer 23 is coated on the Ni layer 22. A Pd layer 24 is coated on the Pd—Ni alloy layer 23.

The Ni layer 22 is formed using a plating solution based on nickel(II) sulfamate tetrahydrate ($Ni(H_2NSO_3)_2 \cdot 4H_2O$). The nickel (II) sulfamate tetrahydrate is a Ni salt of amid sulfonic acid available in the form of a crystal or oversaturated nickel(II) sulfamate tetra hydrate solution, which has a high solubility and increases the metal concentration of the plating bath. As the plating thickness increases, the internal stress and ductility of the metal sheet tend to decrease.

To solve the above problem, first and second additives of an organic compound are added to the Ni plating solution. The first additive is an auxiliary additive for controlling adsorption of a main polish, and enhancing crack-resistance of the plating layer. The first additive includes saccharine, naphthalene-1,3,6-trisulfonic acid trisodium salt hydrate ($C_{10}H_5Na_3O_9S_3$) and naphthalene-1.5-disulfonic acid disodium salt ($C_{10}H_6Na_2O_6S_2$), and each includes an =C—$SO_2$ group.

A second additive is added because the first additive has no leveling effect for planarizing the plating surface. The second additive is a leveler, having strong adsorption, and is co-deposited with Ni to allow polishing and leveling of the plating. The second additive which is most widely used has C=O, C=C, C≡C, C=N, C≡N and N=N groups.

Also, an additional additive is a surface active agent for lowering the surface tension of the solution. This additional additive draws hydrogen ($H_2$) bubbles away from the plating material to reduce the number of pits caused by the $H_2$ bubbles.

However, the Ni layer 22 contains sulfur which is a main component of the first additive, and thus the chemical solubility is sharply increased. During annealing at 200° C. or higher, the sulfur causes rearrangement of atoms, which causes brittleness of the plating layer. This causes brittleness of the Ni layer 22 as an indirect thermal effect of a process of assembling a semiconductor, and thereby causes cracking of the plating during a subsequent trimming and forming process.

SUMMARY OF THE INVENTION

To solve the above problems, it is an objective of the present invention to provide a lead frame having a plating layer which does not become brittle during manufacturing, and a method for manufacturing the same.

Accordingly, to achieve the above objective, a method for manufacturing a lead frame according to the present invention includes the steps of:

(a) degreasing and activating the surface of a metal sheet;

(b) providing a plating solution containing nickel(II) sulfamate tetrahydrate, ($Ni(H_2NSO_3)_2 \cdot 4H_2O$), manganese(II) sulfamate tetrahydrate ($Mn(H_2NSO_3)_2 \cdot 4H_2$), nickel (II) chloride hexahydrate ($NiCl_2 \cdot 6H_2O$), and boric acid;

(c) plating the metal sheet in the plating solution to form a Ni—Mn alloy layer; and (d) forming a Pd or Pd alloy layer on the Ni—Mn alloy layer.

Preferably, the plating solution includes 5~20 g/l of the $Mn(H_2NSO_3)_2 \cdot 4H_2O$ composition.

According to another aspect of the present invention, a lead frame includes: a metal sheet; a Ni—Mn alloy layer having a predetermined thickness coated on the metal sheet; and a Pd or a Pd alloy layer having a predetermined thickness, coated on the Ni—Mn alloy layer.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENTS

Figure 1:
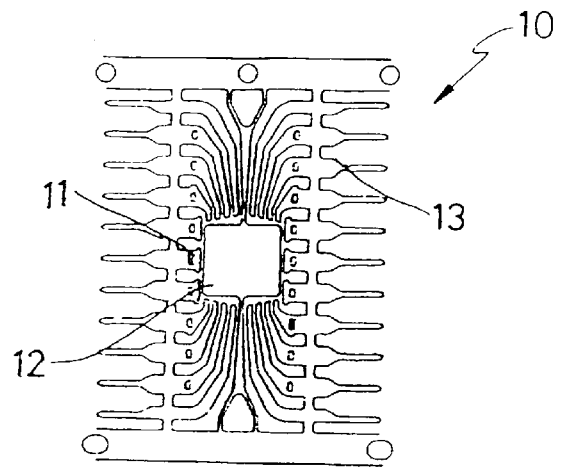
FIG. 1 is a plan view of a typical lead frame.
Figure 2:
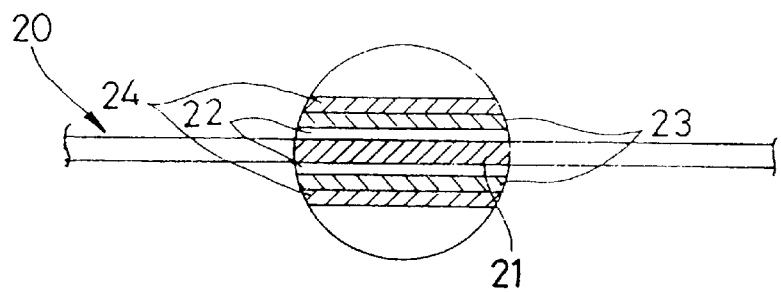
FIG. 2 is a sectional view of the structure of a conventional lead frame.
Figure 3:
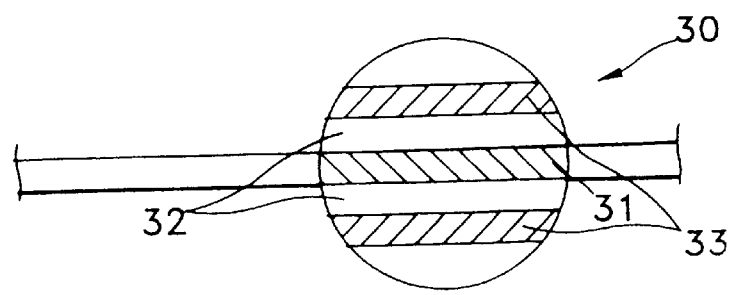
FIG. 3 is a sectional view of the structure of a lead frame according to the present invention.

Referring to FIG. 3, a lead frame 30 according to the present invention includes a metal sheet 31, a Ni—Mn alloy layer 32 coated on the metal sheet 31, and a Pd layer 33 coated on the Ni—Mn alloy layer 32.

Preferably, the metal sheet 31 is formed of one of Cu, Cu alloy, or Ni alloy, and has a thickness of 0.1~3 mm. The metal sheet 31, after degreasing and activating, is coated with the Ni—Mn alloy layer 32. The plating solution contains a Mn compound, preferably nickel(II) sulfamate tetrahydrate, ($Ni(H_2NSO_3)_2 \cdot 4H_2O$), manganese(II) sulfamate tetrahydrate ($Mn(H_2NSO_3)_2 \cdot 4H_2$), nickel (II) chloride hexahydrate ($NiCl_2 \cdot 6H_2O$) and boric acid. The first additive, as a stress reducer, and the second additive, as a leveler, are added to the plating solution.

The metal sheet 31 is put into the plating solution and electroplated to form a Ni—Mn alloy layer 32. The Mn combines with S, which is the main ingredient in the first additive, to form an intermetallic compound MnS, which suppresses plating brittleness caused by rearrangement of S during annealing at 200° C. or higher. The Mn increases the strength of the leadframe at higher temperatures without reducing the length and plasticity. It also enables easy casting of the leadframe. Preferably, the Mn composition of the Ni—Mn alloy layer 32 is 2~10 wt %, and the thickness of the Ni—Mn alloy layer 32 is 0.05~3.0 μm.

Finally, the Pd layer 33 of 0.05~2.0 μm is coated on the Ni—Mn alloy layer 32. Alternatively, a Pd alloy layer having better corrosion resistance than pure Pd may be coated on the Ni—Mn alloy layer 32. Preferably, the Pd alloy layer is formed of one of Pd—Au, Pd—Co, Pd—W, Pd—Ag, Pd—Ti, Pd—Mo or Pd—Sn alloys.

Then, to check the hardness and ductility of the Ni—Mn alloy layer after annealing, a pure Ni layer, a NiS layer, and a NiMnS layer were annealed, and the characteristics thereof were measured. The results are shown in Table 3.

TABLE 3

| | | Alloy | | Hardness (Hv) | | | Ductility |
|---|---|---|---|---|---|---|---|
| Type | Current density (A/dm$^2$) | Mn (%) | S (%) | No heating | 450° C. for 22 hrs | 600° C. for 18 hrs | (cycles) |
| Ni | 6.5 | less than 0.02 | 0.001 | 245 | 145 | 87 | 33 |
| Ni | 2.7 | less than 0.02 | 0.004 | 276 | 172 | 115 | 27 |
| NiS | 2.7 | less than 0.02 | 0.018 | 380 | 186 | 110 | 0 |
| NiS | 6.5 | less than 0.02 | 0.020 | 473 | 182 | 124 | 0 |
| NiMnS | 2.7 | 0.03 | 0.017 | 389 | 158 | 98 | 2 |
| NiMnS | 6.5 | 0.15 | 0.032 | 498 | 215 | 140 | 11 |

According to the present invention, the Ni—Mn alloy layer referred to as a first plating layer and the Pd alloy layer, referred to as a second plating layer, are plated using direct current and pulse current.

The effects of the lead frame having the Ni—Mn alloy layer according to characteristics of the present invention will be described in detail through an example.

EXAMPLE

A plating solution for forming the Ni—Mn alloy layer 32 (see FIG. 3) is composed of 600 g/l of Ni(H$_2$NSO$_3$)$_2$.4H$_2$O, 5~20g/l of Mn(H$_2$NSO$_3$)$_2$.4H$_2$O, 10 g/l of NiCl$_2$.6H$_2$O and 40 g/l of boric acid. The plating is performed with a current density 4.3 A/dm$^2$. The plating solution has a temperature in the range of 45~50° C. and a hydrogen ion concentration of 4.0~4.8 pH.

Figure 4:
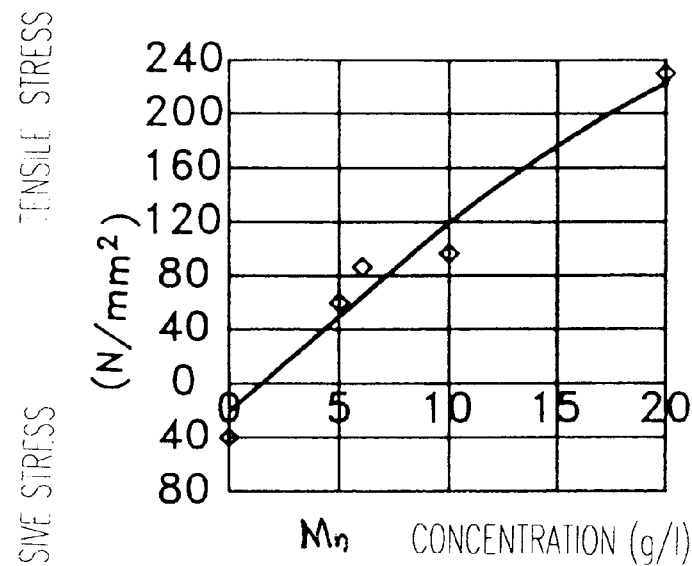
FIG. 4 is a graph of stress in the lead frame according to the present invention measured depending on the amount of manganese (Mn) added to the plating solution.

The stress in the lead frame was measured where the Ni—Mn alloy layer was formed. The stress of the lead frame depending on the amount of Mn(H$_2$NSO$_3$)$_2$.4H$_2$O is shown in Table 1 and FIG. 4. As shown in Table 1, as the amount of Mn(H$_2$NSO$_3$)$_2$.4H$_2$O in the plating solution increases, the tensile stress in the lead frame also increases.

TABLE 1

| Amount of Mn(H$_2$NSO$_3$)$_2$.4H$_2$O (g/l) | Stress (N/mm$^2$) |
|---|---|
| 0 | 40 (compressive stress) |
| 5 | 50 (tensile stress) |
| 10 | 95 (tensile stress) |
| 20 | 235 (tensile stress) |

Figure 5:
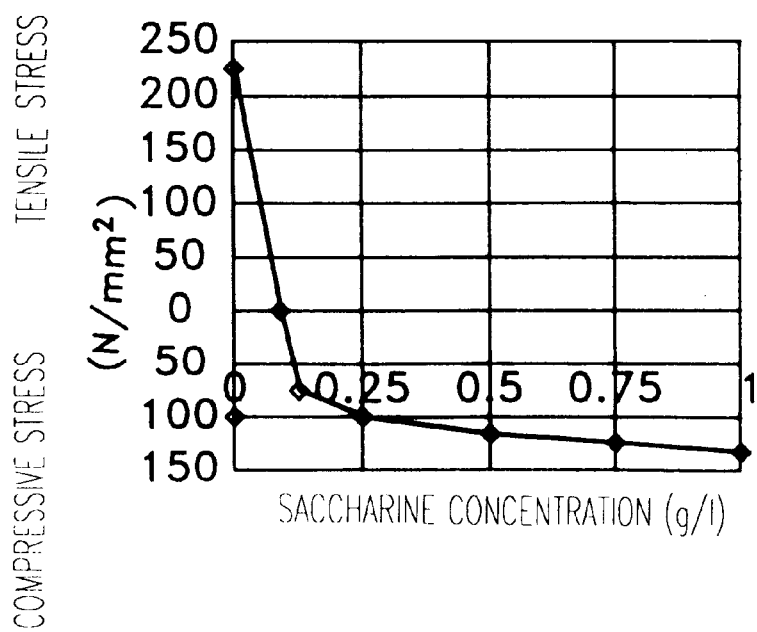
FIG. 5 is a graph of stress in the lead frame according to the present invention measured depending on the concentration of saccharine added to the plating solution.

Then, saccharine of the first additive was added to the plating solution containing 20 g/l of Mn(H$_2$NSO$_3$)$_2$.4H$_2$O, and the Ni—Mn alloy layer was formed. The stress in the lead frame was measured. As shown in Table 2 and FIG. 5, the tensile stress changes to compressive stress with the increase in the amount of saccharine.

TABLE 2

| Amount of saccharine (g/l) | Stress (N/mm$^2$) |
|---|---|
| 0 | 230 (tensile stress) |
| 0.25 | 100 (compressive stress) |
| 0.5 | 120 (compressive stress) |
| 1.0 | 125 (compressive stress) |

The ductility of the samples was measured by counting the number of times the sample could be bent to 90° until the samples broke. Referring to Table 3, the NiS layer has a brittleness higher than the pure Ni layer after annealing. However, the Ni—Mn alloy layer has relatively good ductility. This is caused by a hydrosulfide generated by combining Mn with S.

As described above, using the Ni—Mn alloy layer as an underlayer of the lead frame may suppress brittleness of the plating layer and cracking due to bending during the process of trimming and forming.

It should be understood that the invention is not limited to the illustrated embodiment and that many changes and modifications can be made within the scope of the invention by a person skilled in the art.

What is claimed is:

1. A lead frame comprising:
   a metal sheet;
   a first layer of Ni—Mn alloy having a predetermined thickness, coated on the metal sheet; and
   a second layer of Pd or a Pd alloy having a predetermined thickness, coated on the Ni—Mn alloy layer.

2. The lead frame of claim 1, wherein the metal sheet is formed from a material selected from the group consisting of Cu, Cu alloy and Ni alloy.

3. The lead frame of claim 1, wherein the thickness of the first layer is within the range of 0.05~3.0 μm.

4. The lead frame of claim 1, wherein the second layer is formed of material selected from the group consisting of Pd—Au, Pd—Ni, Pd—Co, Pd—W, Pd—Ag, Pd—Ti, Pd—Mo and Pd—Sn.

5. The lead frame of claim 1, wherein the thickness of the Pd layer is within the range of 0.05~2.0 μm.

6. The lead frame of claim 1, wherein Mn of the Ni—Mn alloy layer is within the range of 2~10 wt %.

7. The lead frame of claim 1, wherein the first Mi—Mn alloy coating comprises a first plating layer.

8. The lead frame of claim 1, wherein the second Pd or Pd alloy coating comprises a second plating layer.

* * * * *